United States Patent
Numata et al.

(10) Patent No.: US 7,538,624 B2
(45) Date of Patent: May 26, 2009

(54) OSCILLATOR HAVING MULTIPLE OSCILLATION UNITS

(75) Inventors: Toshimasa Numata, Yokohama (JP); Alejandro Puel, San Jose, CA (US)

(73) Assignee: Fujitsu Media Devices Limited, Yokohama (JP)

(*) Notice: Subject to any disclaimer, the term of this patent is extended or adjusted under 35 U.S.C. 154(b) by 140 days.

(21) Appl. No.: 11/645,795

(22) Filed: Dec. 27, 2006

(65) Prior Publication Data

US 2008/0157890 A1 Jul. 3, 2008

(51) Int. Cl.
*H03B 5/12* (2006.01)

(52) U.S. Cl. .................. 331/49; 331/56; 331/108 R; 331/117 R; 331/179

(58) Field of Classification Search ............... 331/2, 331/46, 49, 56, 108 R, 117 R, 179
See application file for complete search history.

(56) References Cited

U.S. PATENT DOCUMENTS

| | | | | |
|---|---|---|---|---|
| 5,686,864 A | * | 11/1997 | Martin et al. | ............ 331/1 A |
| 5,955,928 A | * | 9/1999 | Smith et al. | ............ 331/2 |
| 6,566,969 B2 | * | 5/2003 | Matuo et al. | ............ 331/49 |
| 2006/0170512 A1 | * | 8/2006 | Jeon et al. | ............ 331/179 |

FOREIGN PATENT DOCUMENTS

JP        2004-64567 A        2/2004

* cited by examiner

*Primary Examiner*—Robert Pascal
*Assistant Examiner*—Levi Gannon
(74) *Attorney, Agent, or Firm*—Arent Fox LLP.

(57) ABSTRACT

The present invention is an oscillator including: first transistors outputting oscillation signals of different oscillation frequencies to collectors; a common node to which outputs of emitters of the first transistors are connected and input; a feedback circuit feeding an output of the common node to bases of the first transistors; and isolation circuits that are respectively provided between the emitters of the first transistors and the common node and cut off high frequency components from the common node.

10 Claims, 3 Drawing Sheets

OSCILLATOR HAVING MULTIPLE OSCILLATION UNITS

BACKGROUND OF THE INVENTION

1. Field of the Invention

The present invention generally relates to oscillators, and more particularly, to an oscillator having multiple oscillation units capable of outputting different oscillation frequencies.

2. Description of the Related Art

Oscillators, particularly, voltage-controlled oscillators have been used in mobile communication equipment such as PHS (Personal Handyphone System), wireless LAN (Local Area Network), and transceivers.

There is an oscillator capable of oscillating at selectable different frequencies. For example, Japanese Patent Application Publication No. 2004-64567 discloses an oscillator that oscillates at a selected one of three oscillation frequencies. The oscillators are required to have improved C/N (Carrier to Noise) ratios. Further, the oscillator capable of oscillating at selectable oscillation frequencies is required to have a downsized circuitry.

SUMMARY OF THE INVENTION

An object of the present invention is to improve the C/N ratio and downsize the circuitry. According to an aspect of the present invention, there is provided an oscillator including: first transistors outputting oscillation signals of different oscillation frequencies to collectors; a common node to which outputs of emitters of the first transistors are connected and input; a feedback circuit feeding an output of the common node to bases of the first transistors; and isolation circuits that are respectively provided between the emitters of the first transistors and the common node and cut off high frequency components from the common node. The feedback circuit that feeds the outputs of the emitters of the first transistors to the bases can improve the C/N ratio. The downsizing can be achieved by the arrangement of connecting the emitters of the first transistors to the common node via the respective isolation circuits. Further, the isolation circuits can prevent signals from flowing back to the emitters of the first transistors. According to another aspect of the present invention, there is provided an oscillator including: oscillation units outputting oscillation signals of different oscillation frequencies; a common node to which other output signals of the oscillation units are connected and input; a feedback circuit feeding an output of the common node to the oscillation units; and isolation circuits that are respectively provided between the other output signals of the oscillation units and the common node and cut off high frequency components from the common node. The feedback circuit that feeds the other output signals of the oscillation units improves the C/N ratio. Downsizing can be achieved by using the common node to which the oscillation units are connected. The isolation circuits prevent signals from flowing back to the oscillation units.

BRIEF DESCRIPTION OF THE DRAWINGS

Exemplary embodiments of the present invention will be described in detail with reference to the 30 following drawings, wherein.

DESCRIPTION OF THE PREFERRED EMBODIMENTS

A description will now be given, with reference to the accompanying drawings, of exemplary embodiments of the present invention.

First Embodiment

Figure 1:
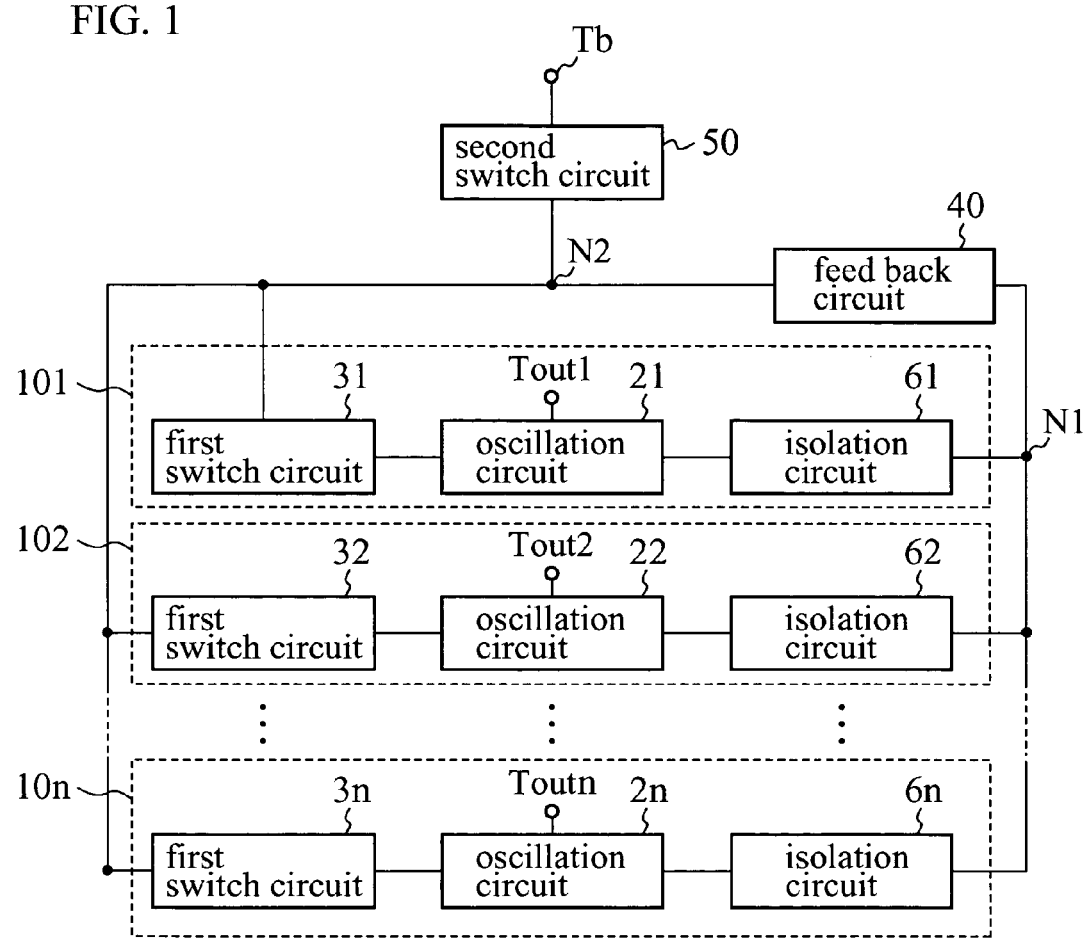
FIG. 1 is a block diagram of an oscillator in accordance with a first embodiment.

FIG. 1 is a block diagram of an oscillator in accordance with a first embodiment. Referring to FIG. 1, the oscillator includes oscillation units 101 through 10$n$, a feedback circuit 40 and a second switch circuit 50. The oscillation units 101 through 10$n$ respectively include first switch circuits 31 through 3$n$, oscillation circuits 21 through 2$n$, and isolation circuits 61 through 6$n$. The first switch circuits 31 through 3$n$ turn ON and OFF power supplies to the oscillation units 101 through 10$n$. The oscillation circuits 21 through 2$n$ output oscillation signals of mutually different frequencies to output terminals Tout1 through Tout$n$, respectively. The isolation circuits 61 through 6$n$ restrict high-frequency noise from a common node N1 to the oscillation circuits 21 through 2$n$. The oscillation circuits 21 through 2$n$ are connected to the common node N1 via the isolation circuits 61 through 6$n$. The common node N1 is input to the feedback circuit 40, and the output of the feedback circuit 40 is connected to a feedback node N2. The feedback node N2 is input the oscillation circuits 21 through 2$n$ via the first switch circuits 31 through 3$n$, respectively. The feedback node N2 is connected to a power supply terminal Tb via the second switch circuit 50.

Figure 2:
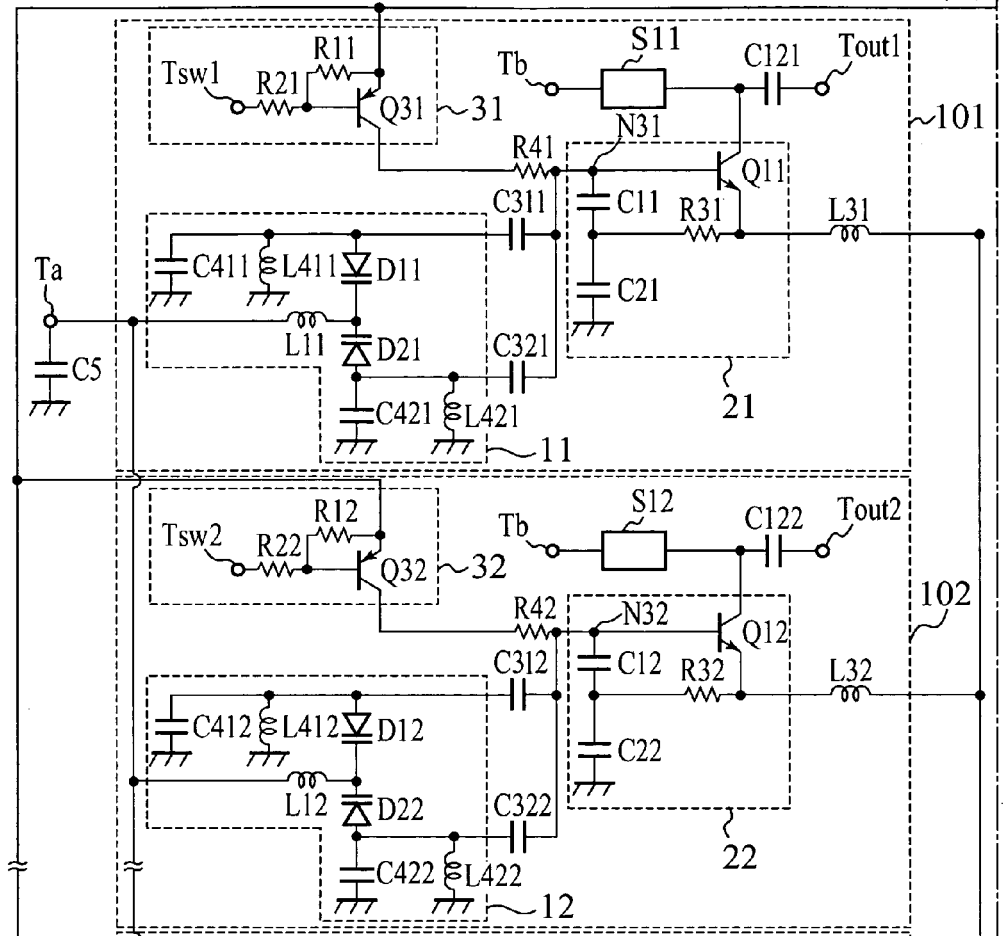
FIG. 2 is a circuit diagram (part 1) of an oscillator in accordance with the first embodiment.
Figure 2:
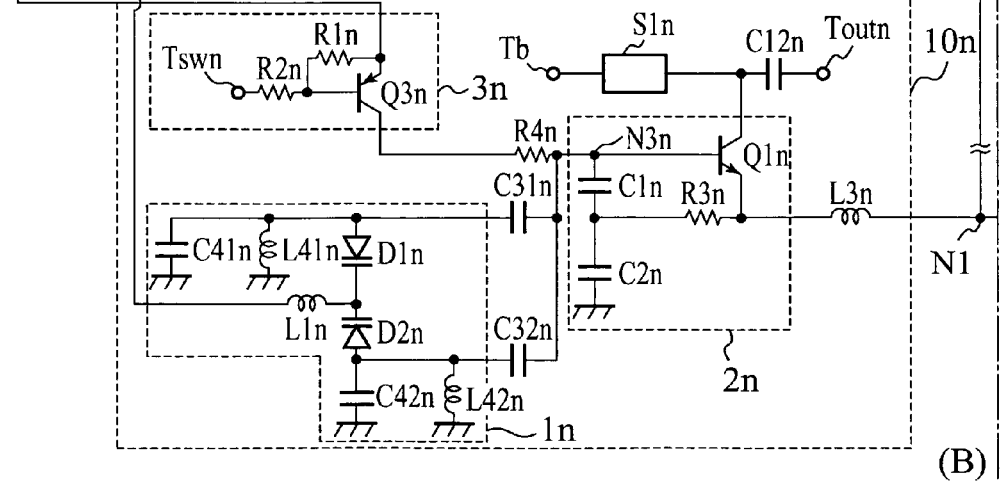
Figure 3:
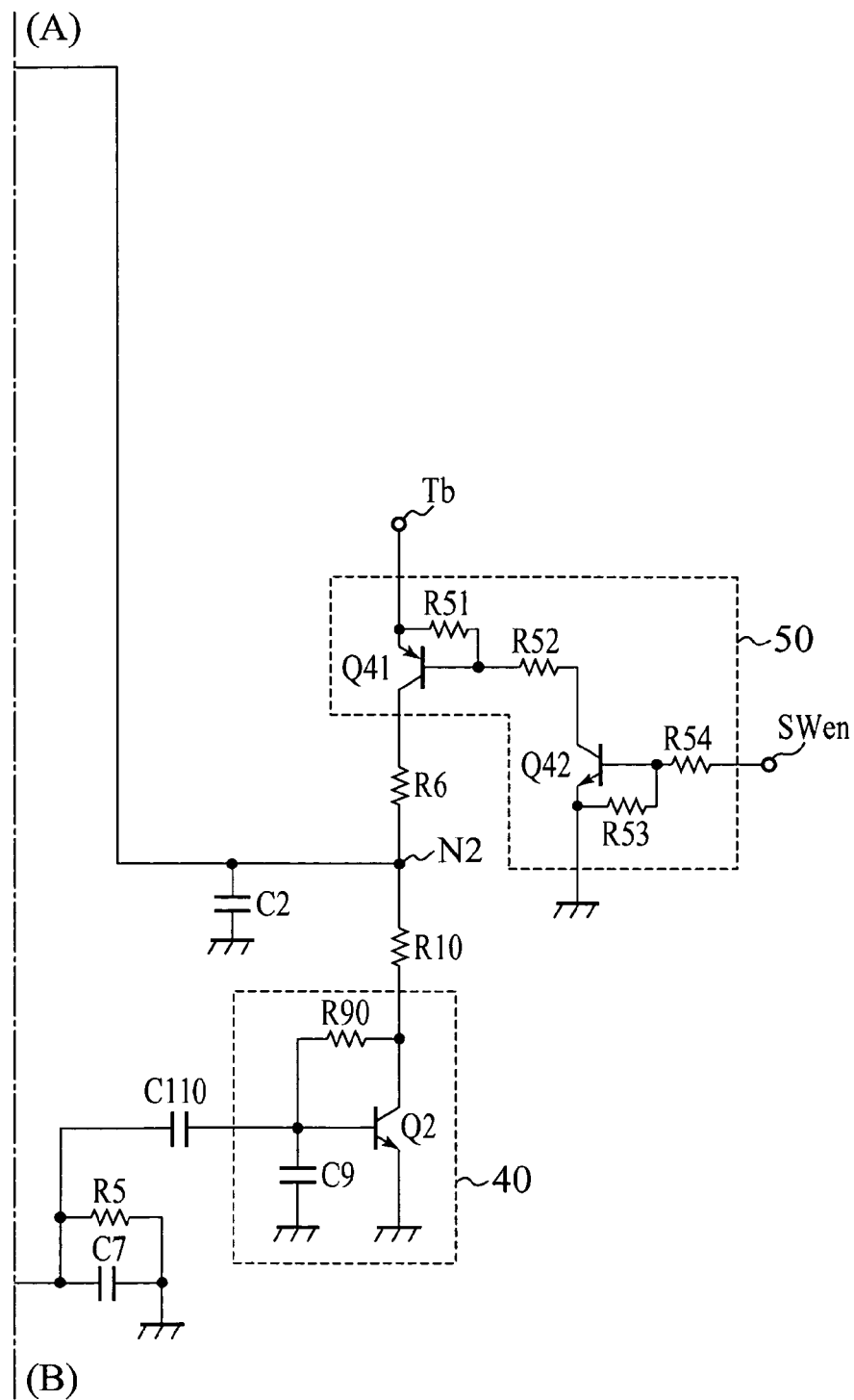
FIG. 3 is a circuit diagram (part 2) of an oscillator in accordance with the first embodiment.

FIGS. 2 and 3 are respectively circuit diagrams of the oscillator of the first embodiment. Parts (A) and (B) of FIG. 2 are respectively connected to parts (A) and (B) of FIG. 3. The oscillation units 101, 102 through 10$n$ are the same as each other, and therefore, only the oscillation unit 10$n$ will now be described, while a description of the other oscillation units 101 and 102 will be omitted. The oscillation unit 10$n$ mainly includes a resonance circuit 1$n$, the oscillation circuit 2$n$, the first switch circuit 3$n$ and a second inductor L3$n$, which is the isolation circuit.

The resonance circuit 1$n$ includes variable capacitance diodes D1$n$ and D2$n$, capacitors C41$n$ and C42$n$, and inductors L41$n$ and L42$n$. The cathodes of the variable capacitance diodes D1$n$ and D2$n$ are coupled to a control terminal Ta via the choke inductor L1$n$. The 10 control terminal Ta is grounded via a capacitor C5 for removal of high frequency components. The anode of the variable capacitance diode D1$n$ is grounded via the capacitor C41$n$ and the inductor L41$n$ connected in parallel. Similarly, the anode of the variable capacitance diode D2$n$ is grounded via the capacitor C42$n$ and the inductor L42$n$ connected in parallel. A voltage applied to the control terminal Ta changes the capacitance values of the variable capacitance diodes D1$n$ and D2$n$. Thus, the resonance circuit in resonates at a desired resonant frequency.

The oscillation circuit 2$n$ includes a first transistor Q1$n$, which is an NPN bipolar transistor, capacitors C1$n$ and C2$n$, and a resistor R3$n$. The base of the first transistor Q1$n$ is grounded via the capacitor C1$n$ and C2$n$ connected in series. A node between the capacitors C1$n$ and C2$n$ is connected to the emitter of the first transistor Q1$n$ via the resistor R3$n$. A node N3$n$ is connected to the collector of the transistor Q3$n$ of the switch circuit 3$n$ via a resistor R4$n$. The oscillation circuit 2$n$ forms a Clap oscillation circuit, which is a kind of Colpitts oscillation circuit. The node N3n is connected to the anodes of the variable capacitance diodes D1n and D2n of the resonance circuit 2n via coupling capacitors C31n and C32n. Thus, the oscillation circuit 2n oscillates at the resonance frequency of the resonance circuit in, and the oscillation signal is output via the collector of the first transistor Q1n. The resistor R3n restricts abnormal oscillation of the oscillation circuit 2n. The oscillation signal output via the collector of the first transistor Q1n is output via the output terminal Toutn having an impedance matched with the output impedance. The capacitor C12n shuts off the dc component. The collector of the first transistor Q1n is supplied from the power supply terminal Tb, with a dc voltage via a line S1n (such as a strip line), which is a choke inductor.

The first switch circuit 3n includes a PNP bipolar transistor Q3n, and resistors R1n and R2n. The emitter of the transistor Q3n is connected to the power supply terminal Tb via a resistor R6 and the second switch circuit 50. A switch terminal Tswn is connected to the base of the transistor Q3n via the resistor R2n, and the resistor R1n is connected between the base and emitter of the transistor Q3n. The collector of the transistor Q3n is connected to the base of the first transistor Q1n via the resistor R4n. The resistor R2n is used to prevent the first transistor Q1n from being broken, and preferably has a resistance in the range of a few kiloohms to tens of kiloohms. The resistor R1n is used to reliably turn OFF the first transistor Q1n.

The first switch circuit 3n supplies power to the oscillation circuit 2n in accordance with a signal applied to the switch terminal Tswn. More specifically, when the first switch circuit 3n is turned ON, power is supplied to the oscillation circuit 2n from the power supply terminal Tb, and the oscillation unit 10n supplies the oscillation signal to the output terminal Toutn. In contrast, when the first switch circuit 3n is turned OFF, no power is supplied to the oscillation circuit 2n, and the oscillation unit 10n does not produce the oscillation signal.

The emitters of the first transistors Q11, Q12 through Q1n of the oscillation circuits 21, 22 through 2n are connected to the common node N1 via second inductors L31, L32 through L3n, respectively. The common node N1 is grounded via a first resistor R5 and a first capacitor C7 connected in parallel. The first resistor R5 is used to adjust current comsumed, and preferably has a resistance of tens of ohms. The first capacitor C7 is used to adjust the balance of the output level, and preferably has a capacitance of a few pF. The common node N1 is connected to the feedback circuit 40.

The feedback circuit 40 includes a second transistor Q2, which is an NPN bipolar transistor, a second resistor R90 and a second capacitor C9. The base of the second transistor Q2 is connected to the common node N1 via a coupling capacitor C110. The coupling capacitor C110 is preferably provided to strengthen the coupling between the oscillation circuit 2n and the feedback circuit 40 and prevent the signal from the first transistor Q1n from being delayed. For example, the coupling capacitor C110 may have a capacitance value of hundreds of nF. The base of the second transistor Q2 is grounded via the second capacitor C9, which is a feedback capacitor. The emitter of the second transistor Q2 is grounded. The second resistor R90 is connected between the base and the collector of the second transistor Q2. The second resistor R90 prevents the collector current from flowing back to the base. The collector of the second transistor Q2 is connected to the feedback node N2 via a resistor R10. The resistor R10 is a bias resistor. The feedback node N2 is connected to the first switch circuits 31 through 3n of the oscillation units 101 through 10n. Thus, the signals of the emitters of the first transistors Q11 through Q1n of the oscillation units 101 through 10n are fed back to the bases of the first transistors Q11 through Q1n via the single common node N1 and the feedback circuit 40.

The feedback node N2 is connected to the power supply terminal Tb via the resistor R6 and the second switch circuit 50. The second switch circuit 50 includes a PNP bipolar transistor Q41, an NPN bipolar transistor Q42, and resistors R51 through R54. The second switch circuit 50 connects and disconnects the power supply terminal Tb and the feedback node N2 in accordance with a switch signal applied to a switch terminal SWen. When the second switch circuit 50 is turned OFF, power supply from the feedback circuit 40 and the oscillation units 101 through 10n can be shut off. The capacitor C2 connected between the feedback node N2 and the ground is for use in removal of high-frequency components.

The oscillator of the first embodiment includes multiple first transistors Q11 through Q1n in which different oscillation frequencies are output via the collectors thereof. The emitter outputs of the first transistors Q11 through Q1n are coupled via the respective isolation circuits and are then connected to the common node N1. Further, the oscillation circuit is equipped with the feedback circuit 40 that feeds the output of the common node N1 back to the bases of the first transistors Q11 through Q1n. Furthermore, the oscillator has the inductors L31 through L3n, which are the isolation circuits that are provided between the emitters of the first transistors Q11 through Q1n and the common node N1 and cut off the high-frequency components from the common node N1.

The first transistors Q11 through Q1n are supplied with the resonance signal via the bases, and the voltages of the emitters are followed by the input sides. That is, the first transistors Q11 through Q1n are connected in the collector grounded formation (emitter follower). The collector-grounded circuit outputs, via the emitter, a waveform that is the same waveform as that of the base voltage and is offset by −0.6 V from the base voltage. Further, the collector-grounded circuit has a high input impedance (the impedance of the base), a low output impedance (the impedance of the emitter), and a voltage gain approximately equal to 1. Furthermore, the collector-grounded circuit has low distortion and good frequency characteristics. Thus, the C/N ratio can be improved by feeding the emitter outputs of the first transistors Q11 through Q1n to the bases of the first transistors Q11 through Q1n via the feedback circuit 40.

The oscillation circuits 21 through 2n may employ the first transistors Q11 through Q1n having a large current gain β, so that the base currents of the first transistors Q11 through Q1n can be amplified to flow large currents through the collectors. It is thus possible to obtain the large oscillation signals via the output terminals Tout1 through Toutn. As the oscillation signal has increased power, the C/N ratio can be enhanced.

As described above, the signals are fed back to the bases of the first transistors Q11 through Q1n from the emitters thereof via the feedback circuit 40. The oscillation signals are output from the collectors of the first transistors Q11 through Q1n. It is thus possible to improve the C/N ratio and restrict phase noise.

The emitters of the first transistors Q11 through Q1n of the oscillation units 101 through 10n are connected to the common node N1, and are fed back to the bases of the first transistors Q11 through Q1n by means of the single feedback circuit 40. It is thus possible to miniaturize the oscillator.

In the case where the emitters of the first transistors Q11 through Q1n are commonly connected to the feedback circuit 40, unnecessary signals may flow back to, for example, the emitter of the first transistor Q11 from the feedback circuit 40 and the other first transistors Q12 through Q1n. Particularly, unnecessary signals of frequencies higher than the oscillation frequency such as harmonic components may flow back. With the above in mind, in accordance with the first embodiment, the second inductors L31 through L3n serving as the isolation circuits are provided between the emitters of the first transistors Q11 through Q1n to the common node N1. It is thus possible to prevent the unnecessary signals of frequencies higher than the oscillation frequency from flowing back to the emitter of the first transistor Q11 from the feedback circuit 40 and the other first transistors Q12 through Q1n.

The first embodiment has the multiple first switch circuits 31 through 3n that turn ON and OFF the first transistors Q11 through Q1n. By operating one of the oscillation units 101 through 10n, the desired oscillation frequency is available.

The first switch circuits 31 through 3n are connected between the power supply terminal Tb and the bases of the first transistors Q11 through Q1n. It is thus possible to selectively operate the oscillation units 101 through 10n. The first switch circuit 31 may be provided between the collectors of the first transistors Q11 through Q1n and the power supply terminal Tb.

Preferably, the output of the feedback circuit 40 is coupled with the power supply terminal Tb. It is thus possible to use the same line for power supply and transmission of feedback signal to the feedback circuit 40.

Preferably, the common node N1 is grounded via the first capacitor C7 and the first resistor R5 connected in parallel. The first resistor R5 may adjust the current consumed, and the first capacitor C7 adjusts the balance of the output level.

Preferably, the feedback circuit 40 includes the second transistor Q2, and the common node N1 is connected to the base of the second transistor Q2. Further, the bases of the first transistors Q11 through Q1n are coupled with the collector of the second transistor Q2. Thus, the feedback circuit 40 has the emitter-grounded circuitry. With this structure, the emitter outputs of the first transistors Q11 through Q1n are fed back to the bases of the first transistors Q11 through Q1n, and the C/N ratio can be improved.

Preferably, the common node N1 is connected to the base of the second transistor Q2 via the coupling capacitor C110, and the base of the second transistor Q2 is grounded via the second capacitor C9. The second resistor R90 is connected between the base and the collector of the second transistor Q2. The second capacitor C9 functions as a feedback capacitor. The second resistor R90 prevents reverse flow of the collector current to the base.

Preferably, the second switch circuit 50 is provided between the power supply terminal Tb and the feedback node N2 (that is, the first transistors Q11 through Q1n). The second switch circuit 50 cuts off the power supply to the oscillation units 101 through 10n all at once.

The third capacitors C11 through C1n and the fourth capacitors C21 through C2n respectively connected in series are provided between the bases of the first transistors Q11 through Q1n and the ground. The nodes N31 through N3n between the third capacitors C11 through C1n and the fourth capacitors C21 through C2n are connected to the emitters of the transistors Q11 through Q1n, respectively. Thus, the oscillation circuits 21 through 2n have the configuration of the Clap oscillation circuit including the coupling capacitors C311 through C31n and C321 through C32n.

Preferably, the isolation circuits may include the second inductors L31 through L3n. It is thus possible to configure the simplified isolation circuits capable of cutting off higher frequency components than the oscillation frequency.

In the first embodiment, the output terminals Tout1 through Toutn of the oscillation units 101 through 10n are separately provided. Alternatively, a common output terminal may be employed.

In the first embodiment, the oscillation signals of the frequencies of the oscillation units 101 through 10n are output via the collectors of the first transistors Q11 through Q1n. The different outputs of the oscillation units 101 through 10n applied to the common node are the emitter outputs of the first transistors Q11 through Q1n. Further, the inputs of the oscillation units 101 through 10n output by the feedback circuit 40 are the bases of the first transistors Q11 through Q1n. The outputs and inputs of the oscillation units 101 through 10n are not limited to the above.

Although a few specific exemplary embodiments employed in the present invention have been shown and described, it would be appreciated by those skilled in the art that changes may be made in these exemplary embodiments without departing from the principles and sprits of the invention, the scope of which is defined in the claims and their equivalents.

What is claimed is:

1. An oscillator comprising:
   first transistors outputting oscillation signals of different oscillation frequencies from collectors;
   a common node to which outputs of emitters of the first transistors are connected and input;
   a feedback circuit feeding an output of the common node to bases of the first transistors; and
   isolation circuits that are respectively provided between the emitters of the first transistors and the common node and cut off high frequency components from the common node.

2. The oscillator as claimed in claim 1, further comprising first switch circuits that respectively turn ON and OFF the first transistors.

3. The oscillator as claimed in claim 2, wherein the first switch circuits are respectively coupled between a power supply terminal and the bases of the first transistors.

4. The oscillator as claimed in claim 1, wherein:
   the feedback circuit has a second transistor; and
   a collector of the second transistor is connected to a power supply terminal.

5. The oscillator as claimed in claim 1, wherein the common node is grounded via a first capacitor and a first resistor connected in parallel.

6. The oscillator as claimed in claim 1, wherein the feedback circuit includes a second transistor, and the common node is connected to the base of the second transistor, the bases of the first transistors being connected to the collector of the second transistor.

7. The oscillator as claimed in claim 6, wherein;
   the common node is connected to the base of the second transistor via a coupling capacitor;
   the base of the second transistor is grounded via a second capacitor; and
   a resistor is connected between the base and collector of the second transistor.

8. The oscillator as claimed in claim 1, further comprising a second switch circuit between a power supply terminal and the first transistors.

9. The oscillator as claimed in claim 1, further comprising third capacitors and fourth capacitors connected in series between the bases of the first transistors and ground; and
   nodes of the third and fourth capacitors are connected to the emitters of the first transistors.

10. The oscillator as claimed in. claim 1, wherein the isolation circuits respectively include second inductors.

* * * * *